(12) United States Patent
Takahashi et al.

(10) Patent No.: US 7,864,598 B2
(45) Date of Patent: Jan. 4, 2011

(54) DYNAMIC RANDOM ACCESS MEMORY DEVICE SUPPRESSING NEED FOR VOLTAGE-BOOSTING CURRENT CONSUMPTION

(75) Inventors: Hiroyuki Takahashi, Kawasaki (JP); Atsushi Nakagawa, Kawasaki (JP)

(73) Assignee: Renesas Electronics Corporation, Kanagawa (JP)

( * ) Notice: Subject to any disclaimer, the term of this patent is extended or adjusted under 35 U.S.C. 154(b) by 290 days.

(21) Appl. No.: 12/025,066

(22) Filed: Feb. 4, 2008

(65) Prior Publication Data

US 2008/0219062 A1 Sep. 11, 2008

(30) Foreign Application Priority Data

Mar. 7, 2007 (JP) .............................. 2007-056922

(51) Int. Cl.
*G11C 5/14* (2006.01)
(52) U.S. Cl. .................. 365/189.09; 365/102; 365/149; 365/210.1; 365/196; 365/202; 365/204; 365/205; 365/207; 365/210.12

(58) Field of Classification Search ............ 365/189.09, 365/102, 149, 155, 186, 196, 202, 204, 205, 365/207, 210.12, 210.1, 210.13, 222
See application file for complete search history.

(56) References Cited

U.S. PATENT DOCUMENTS

| 6,914,840 | B2 | 7/2005 | Agata |
| 7,391,639 | B2 * | 6/2008 | Gogl ......................... 365/148 |
| 2009/0027984 | A1 * | 1/2009 | Mizuno et al. ............. 365/203 |

FOREIGN PATENT DOCUMENTS

JP        2004-265533       9/2004

* cited by examiner

*Primary Examiner*—Hoai V Ho
*Assistant Examiner*—Fernando N Hidalgo
(74) *Attorney, Agent, or Firm*—Young & Thompson

(57) ABSTRACT

In one embodiment, a semiconductor memory device includes a plurality of pairs of bit lines, each of said pairs including a first bit line, a second bit line, a memory cell coupled to said first bit line, a sense amplifier determining the logical value stored in the memory cell according to a potential difference between the first and the second bit line, a reference voltage generation circuit, and a reference voltage supply switch coupling an output of the reference voltage generation circuit to the second bit line.

9 Claims, 9 Drawing Sheets

DYNAMIC RANDOM ACCESS MEMORY DEVICE SUPPRESSING NEED FOR VOLTAGE-BOOSTING CURRENT CONSUMPTION

BACKGROUND OF THE INVENTION

1. Field of the Invention

The present invention relates to a semiconductor memory device and in particular to a Dynamic Random Access Memory (hereinafter referred to as a DRAM).

2. Description of Related Art

A DRAM cell that stores data using a capacitor has been widely known as a semiconductor memory device. In the DRAM, a precharge operation is carried out to set a potential level of each bit lines to a predetermined level before reading or writing data.

A half VDD precharge method is generally used as the precharge method. A potential level of each bit lines is set to about a half potential of a power supply potential VDD in the half VDD precharge method. As the power supply voltage VDD becomes lower, the level set by the precharge method also becomes lower in these days. Therefore, in the above-mentioned half VDD precharge method, it is difficult for a sense amplifier to amplify a difference of potential between bit lines potential with high accuracy, because the precharged level is close to a threshold level of the sense amplifier.

In order to deal with the above mentioned problem, a technique to set the precharge level to the ground potential GND has recently become popular. This technique to precharge the bit line to GND level is disclosed in Japanese Unexamined Patent Application Publication No. 2004-265533.

FIG. 8 shows a circuit diagram of the DRAM cell that performs the GND precharge operation. A pair of bit lines BT and BN is shown in FIG. 8. In the circuit shown in FIG. 8, a memory cell (hereinafter referred to as a main cell) $CELL_T$ and a reference cell (hereinafter referred to as a ref-cell) $CELL_{Ref}$ are connected to each of the bit line pair BT, BN respectively. The main cell $CELL_T$ stores a real data. The ref-cell $CELL_{Ref}$ outputs a reference voltage. A precharge circuit PRE and a sense amplifier SA are connected between the bit line pair BT, BN.

With reference to FIG. 9, an operation of the circuit shown in FIG. 8 is explained. Before a readout operation, the bit line pair BT, BN is precharged to the ground potential GND. When word lines WL, WR are raised to a predetermined potential, the main cell $CELL_T$ and the ref-cell $CELL_{Ref}$ start to discharge the stored charge to the bit lines BT, BN. At this time, the ref-cell $CELL_{Ref}$ outputs a voltage of around a half level of a voltage corresponding to H level voltage output from the main cell $CELL_T$. This makes it possible to perform normal sensing operation even if L level is stored in the main cell $CELL_T$.

Next, the sense amplifier SA is activated by a sense amplifier drive signal SE. The sense amplifier SA amplifies a difference in voltage of the bit line pair to perform readout operation and so on. After this operation of readout and so on, the bit line pair is precharged to GND again. This GND precharge operation is performed by the precharge circuit PRE. The precharge circuit PRE starts to perform the GND precharge operation when a precharge signal PDL is raised to a predetermined potential. During this precharge operation, a word line WRP is raised to a potential which is higher than the power supply potential. The ref-cell $CELL_{Ref}$ is connected to a power source circuit outputting a voltage of ½ VDD via a transistor formed inside the ref-cell $CELL_{Ref}$. Note that the power source to which the reference cell is connected is different from a power source for the bit lines BT, BN.

As a result of this operation, about half of charge stored in the ref-cell $CELL_{Ref}$ is discharged even if the bit line BN is set to H level by the sense amplifier SA during the readout operation and the ref-cell stores charge enough for H level. In this way, the ref-cell $CELL_{Ref}$ outputs around a half voltage against the H level voltage output from the main cell $CELL_T$ during the readout operation, as a result of connecting the ref-cell $CELL_{Ref}$ with ½ VDD during the precharge operation.

In the DRAM cell according to the above-mentioned GND precharge method, each of the three word lines WL, WR, and WRP is required to be raised in potential at every reading or writing operation. When the memory cell is charged or discharged to the power source voltage H level, it is required to apply a voltage higher than the power source voltage against a gate of a transistor of the memory cell. Therefore, it is needed to activate a voltage-boosting circuit for raising the potential level of the three word lines, thereby increasing an amount of current consumption.

It is also required for the ref-cell $CELL_{Ref}$ to output a voltage around half of the H level voltage output from the main cell $CELL_T$ so as to make the sense amplifier operable. But, there are cases where a voltage output from the ref-cell $CELL_{Ref}$ is not enough for the sense amplifier to operate with high stability because of an tolerance of the capacitance of the main cell $CELL_T$ and the ref-cell $CELL_{Ref}$.

In case of using the GND precharge method, an amount of current consumption is increased, and it is difficult to make the sense amplifier operable with high stability because of the tolerance between circuit elements.

SUMMARY

In one embodiment, a semiconductor memory device includes a plurality of pairs of bit lines, each of said pairs including a first bit line, a second bit line, a memory cell coupled to said first bit line, a sense amplifier determining the logical value stored in the memory cell according to a potential difference between the first and the second bit line, a reference voltage generation circuit, and a reference voltage supply switch coupling an output of the reference voltage generation circuit to the second bit line.

As a result of decreasing a number of transistors for inputting a boosted voltage to a gate, it is possible to suppress an increase of current consumption in a voltage-boosting circuit and make a sense amplifier operable with high stability.

BRIEF DESCRIPTION OF THE DRAWINGS

The above and other objects, advantages and features of the present invention will be more apparent from the following description of certain preferred embodiments taken in conjunction with the accompanying drawings, in which.

DETAILED DESCRIPTION OF THE PREFERRED EMBODIMENTS

The invention will now be described herein with reference to illustrative embodiments. Those skilled in the art will recognize that many alternative embodiments can be accomplished using the teachings of the present invention and that the invention is not limited to the embodiments illustrated for explanatory purposes.

First Embodiment

Figure 1:
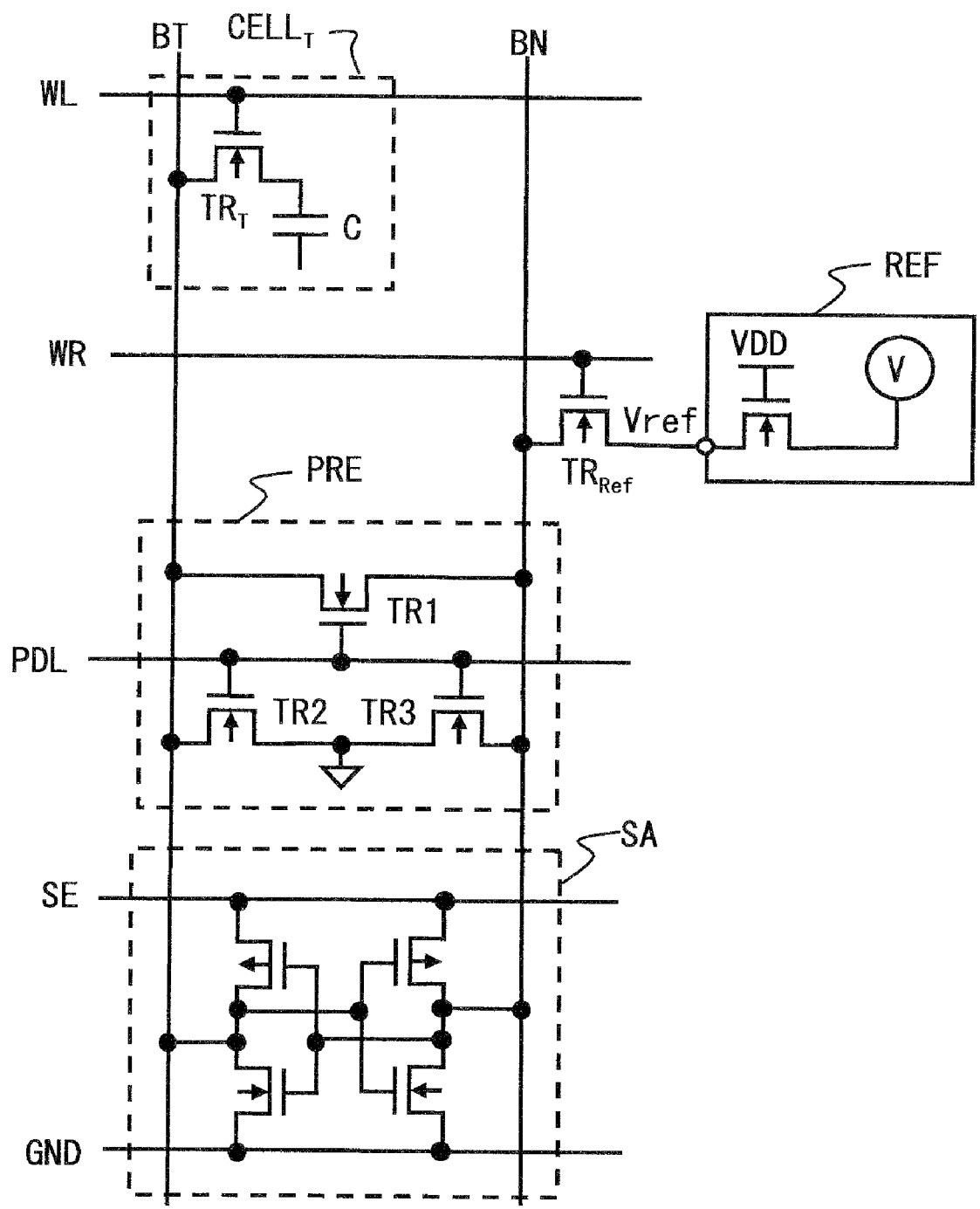
FIG. 1 is a circuit diagram showing a semiconductor memory circuit of a first embodiment.

A first embodiment of this invention is explained below with references to drawings. FIG. 1 is a view showing a circuit of one of a bit line pair of a DRAM of this embodiment. As shown in FIG. 1, the DRAM of this embodiment includes bit lines BT, BN, a memory cell $CELL_T$, a transistor for supplying a reference voltage (a reference voltage supply switch) $TR_{Ref}$, a precharge circuit PRE, a sense amplifier SA, and a reference voltage generation circuit REF. Note that the memory cell $CELL_T$ memorizes data and hereinafter referred to as a main cell.

The main cell $CELL_T$ is comprised of an n-mos (n-type Metal Oxide Semiconductor) transistor $TR_T$ and a capacitor C. A gate of the transistor $TR_T$ of the main cell $CELL_T$ is connected to a word line WL. One of a source or drain of the main cell $CELL_T$ is connected to a bit line BT and the other is connected to the capacitor C. The main cell $CELL_T$ memorizes a logical value of H or L by storing charge in the capacitor C. When the charges stored in the capacitor C are read out, the bit line BT is set to a voltage (a first voltage) corresponding to H level or a voltage (a second voltage) corresponding to L level.

The transistor $TR_{Ref}$ is a switch comprised of an n-mos transistor. A gate of the transistor $TR_{Ref}$ is connected to the word line WR, a source of the transistor $TR_{Ref}$ is connected to the bit line BN, and a drain of the transistor $TR_{Ref}$ is connected to a reference voltage Vref. The reference voltage Vref is a predetermined voltage generated by the reference voltage generation circuit REF. The reference voltage Vref is a voltage calculated in advance based on a voltage output to the bit line BT when the main cell $CELL_T$ outputs H level.

The reference voltage Vref is set to a voltage level around a half of an H level voltage output from the main cell $CELL_T$. For example, if the main cell $CELL_T$ stores H level, a voltage of the bit line BT during the data readout period becomes around 0.2 V in this embodiment. In this case the reference potential Vref is set to 0.1 V. It is possible to calculate the output voltage corresponding to H level of the main cell $CELL_T$ in advance from a power source voltage VDD, electrical discharge characteristics of the capacitor C of the main cell $CELL_T$, and characteristics of the transistor $TR_T$ and so on.

The reference voltage Vref is supplied to the bit line BN and input to the sense amplifier SA when the transistor $TR_{Ref}$ becomes electrically conductive states.

The precharge circuit PRE is comprised of three transistors TR1, TR2, and TR3. The transistor TR1 is connected between the bit lines BT and BN. The transistor TR2 is connected between the bit line BT and a ground potential (GND level).

The transistor TR3 is connected between the bit line SN and the ground potential Gates of the transistors TR1 to TR3 are connected to a precharge line PDL. By setting the precharge line PDL H level, the transistors TR1 to TR3 are turned on, and the bit lines BT, BN are precharged to GND level.

The sense amplifier SA is connected between the bit lines BT and BN. The sense amplifier SA is a well-known sense amplifier having two inverters connected in series. When a sense enable signal SE is set to H level, the sense amplifier SA amplifies a potential difference between the bit lines BT and BN. The logical value stored in the main cell $CELL_T$ is determined based on the output from the sense amplifier SA.

The reference voltage generation circuit REF is a power supply circuit to generate the reference voltage. The reference voltage generation circuit REF is comprised of a constant voltage source and an n-mos transistor that is in ON states constantly. Note that the configuration of the reference voltage generation circuit REF shown in FIG. 1 is just an example. In this example, the reference voltage is determined by the constant voltage source. That is, a voltage generated in the constant voltage source passes through the n-mos transistor by applying the power source voltage VDD to a gate of the n-mos transistor.

The configuration of the reference voltage generation circuit REF is not limited to the example shown in FIG. 1. It is possible to minimize the voltage generated in the constant voltage source by the n-mos transistor. In this case, it is possible to supply a reference voltage lower than the voltage actually generated in the constant voltage source by applying a voltage lower than the power source voltage VDD to the gate of the n-mos transistor. It is also possible to control ON/OFF of the n-mos transistor corresponding to modes by making a logical signal input to the gate of the reference voltage generation circuit REF. Note that the logical signal is equal to a logic for controlling the word line.

Figure 2:
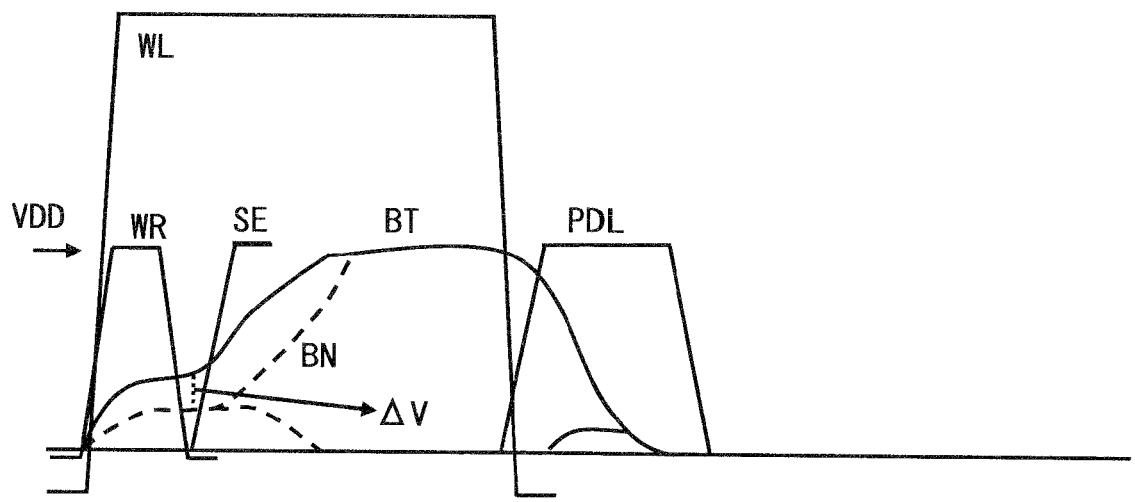
FIG. 2 is a timing chart showing an operation of the circuit of the first embodiment.

FIG. 2 is a timing chart for showing an operation of the memory circuit of this embodiment. An operation of the memory circuit is explained hereinafter with reference to FIG. 2.

In order to read out the data stored in the main cell $CELL_T$ in a state where the bit lines are precharged to ground potential, the word line WL connected to the main cell $CELL_T$ is raised in potential to a voltage VPP higher than the power source voltage and the word line WR connected to the transistor $TR_{Ref}$ for supplying the reference level is raised in potential to the power source voltage level VDD.

At this time, it is required to raise a potential level of the word line WL to a boosted voltage VPP in order to input/output a voltage of power source voltage VDD level. Note that the word line WL corresponds to the main cell $CELL_T$. On the other hand, the reference voltage Vref (0.1V in this embodiment) passes through the reference cell $CELL_{ref}$. Therefore, a power source voltage VDD is enough as a voltage applied to the gate of the reference voltage supply transistor $TR_{Ref}$.

Then, a potential level of the word line WR connected to the transistor $TR_{Ref}$ lowers to around ground potential and an operation of the sense amplifier SA is started by raising the sense enable signal SE. The sense amplifier SA amplifies a potential difference between the bit lines BT and BN and determines the data stored in the main cell $CELL_T$.

Then a potential level of the word line WL connected to the main cell $CELL_T$ is lowered, and a potential level of the precharge signal line PDL is raised to VDD level. The transistors TR1, TR2, and TR3 become ON-state after the precharge signal PDL is raised, and the bit lines BT and BN are precharged to ground potential.

From the readout operation to the precharge operation, it is possible to limit a number of word lines that is to be raised in potential to a voltage higher than the power source voltage. In other words, just one word line is to be raised in potential to a voltage higher than the power source voltage in this embodiment. Therefore it is realized to suppress an increase of current consumption in the voltage-boosting circuit.

The configuration of the memory circuit of this embodiment does not include a ref-cell which has a same structure with the main cell $CELL_T$. Therefore, there is no need to connect a ref-cell with a bit line forming the other of the bit line pair, even if one of the bit line of the bit line pair is connected to the main cell $CELL_T$. It is possible to set a level of the bit line BN before the sense amplifier starts to operate without being effected by the tolerance of the capacitance generated in the ref-cell. This makes it possible to stable a potential difference ($\Delta V$ in FIG. 2) in the bit line pair at the time when the sense amplifier amplifies the potential difference of the bit line pair. Thereby, an operation of the sense amplifier SA is stabled.

In the conventional memory cell using the ref-cell, it is required to make two transistors inside the ref-cell. Therefore, it was difficult to form the transistor, for connecting the capacitance of the ref-cell with the bit line BN, to have the same shape with the main cell $CELL_T$. In this embodiment, the transistor connected to the bit line BN is just required to be capable of supplying the reference level voltage. There is no need to form the transistor to have the same shape with the transistor $TR_T$ formed in the main cell $CELL_T$, thereby making it easy to form DRAM device.

Furthermore, the ref-cell is connected to the power source circuit outputting a voltage ½ VDD half of the power source voltage during the precharge period in the above-mentioned method using the ref-cell.

At this time, a voltage (power source voltage VDD) higher than the voltage ½ VDD half of the power source voltage or a voltage lower than the voltage ½ VDD half of the power source voltage is applied to the power supply circuit.

In case that the power source circuit is configured with a normal operational amplifier, it is required to provide a dead band so as to correspond to a positive or negative current generated during the precharge operation. In case of providing the dead band in the power supply circuit, fluctuations are generated in the voltage ½ VDD output from the power source circuit. As a result of the fluctuations, the potential difference ($\Delta V$) of the bit line pair at the time when the sense amplifier SA starts to operate is changed, thereby disturbing the stable operation of the sense amplifier SA.

Compared with the above mentioned case, it is just enough for the power source circuit to be capable of generating the reference voltage Vref stably and to charge the capacitance of the bit line pair in this embodiment. Therefore, the power source circuit can operate stably, and the potential difference ($\Delta V$) of the bit line pair is stabled, and the sense amplifier SA can operate stably.

Figure 3:
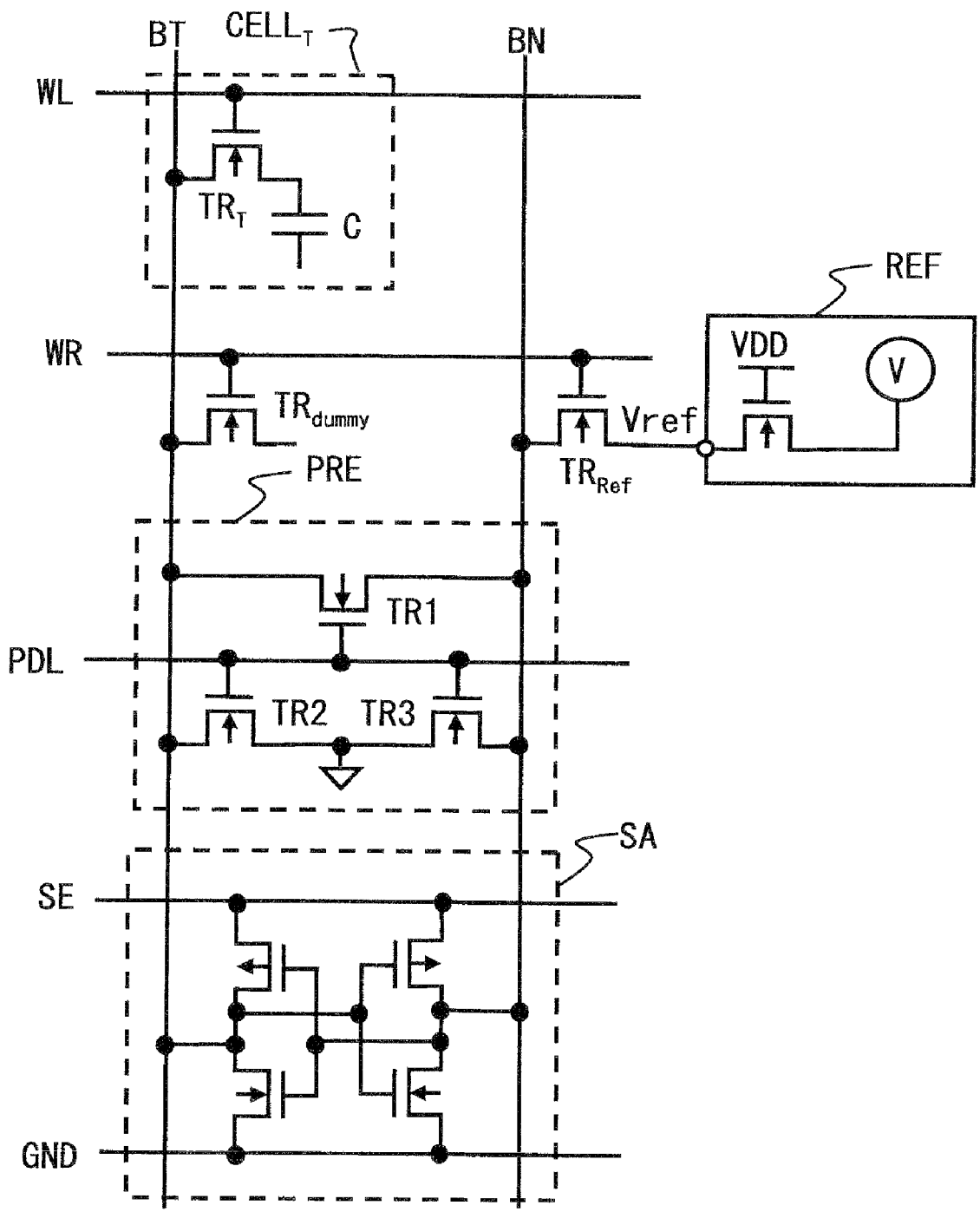
FIG. 3 is a circuit diagram of the semiconductor memory circuit of the first embodiment with a dummy transistor.

There is a possibility that a noise caused by a parasitic capacitance of the transistor $TR_{Ref}$ is applied to the bit line BN during the readout operation in case that the transistor $TR_{Ref}$ is connected to the bit line BN as in this embodiment. For dealing with this problem, it is possible to provide a dummy transistor $TR_{dummy}$ at the bit line BT side as shown in FIG. 3. A gate of the dummy transistor $TR_{dummy}$ is connected to the word line WR, one of a source or drain of the dummy transistor $TR_{dummy}$ is connected to the bit line BT, and the other is set to be floating (high impedance).

The dummy transistor $TR_{dummy}$ is formed in the same process with the transistor $TR_{Ref}$. The dummy transistor $TR_{dummy}$ has substantially the same size with the transistor $TR_{Ref}$. Therefore a parasitic capacitance of the dummy transistor $TR_{dummy}$ is set to be equal to that of the transistor $TR_{Ref}$.

When the dummy transistor $TR_{dummy}$ is provided, it is possible to cause the same effect in the bit line BT as in the bit line BN when switching the potential level of the word line WR, thereby making it unnecessary to consider the effect of the parasitic capacitance of the transistor $TR_{Ref}$.

Second Embodiment

Figure 4A:
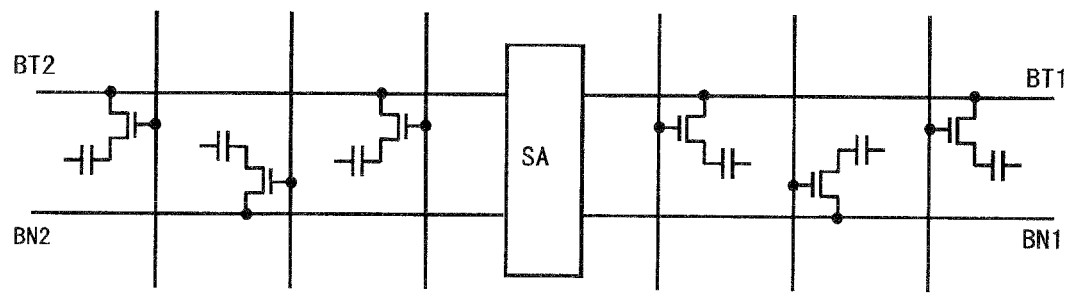
FIGS. 4A to 4C are views showing a layout style of a memory cell of a DRAM.
Figure 4B:
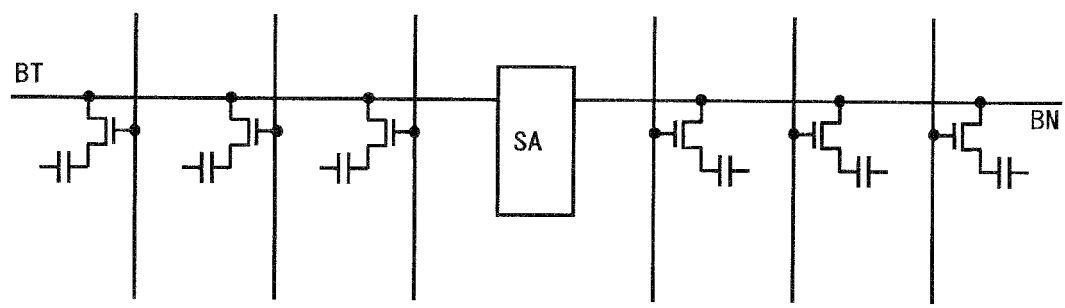

A second embodiment of this invention is explained below with references to drawings. A plurality of memory cells are connected to one sense amplifier in an actual DRAM. FIGS. 4A and 4B each shows an exemplary layout of connecting the plurality of memory cells to one sense amplifier. Note that the precharge circuit and other elements are omitted in FIGS. 4A and 4B, because FIGS. 4A and 4B are views for explaining exemplary layouts.

FIG. 4A shows a layout of a folded bit arrangement where a bit line pair is arranged at one side of the sense amplifier. As shown in FIG. 4A, the sense amplifier SA is shared among the bit line pair BT1 and BN1 at the right side and the bit line pair BT2 and BN2 at the left side. Note that, the words indicating the directions are used on the assumption that the drawings are seen in front.

FIG. 4B shows a layout of an open bit arrangement where a bit line pair is formed by arranging a bit line BT at the left side of the sense amplifier and a bit line BN at the right side of the sense amplifier.

Figure 4C:
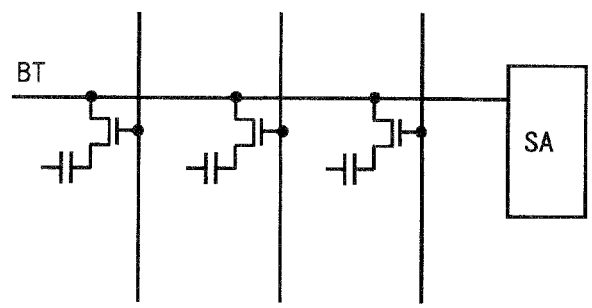
Figure 5:
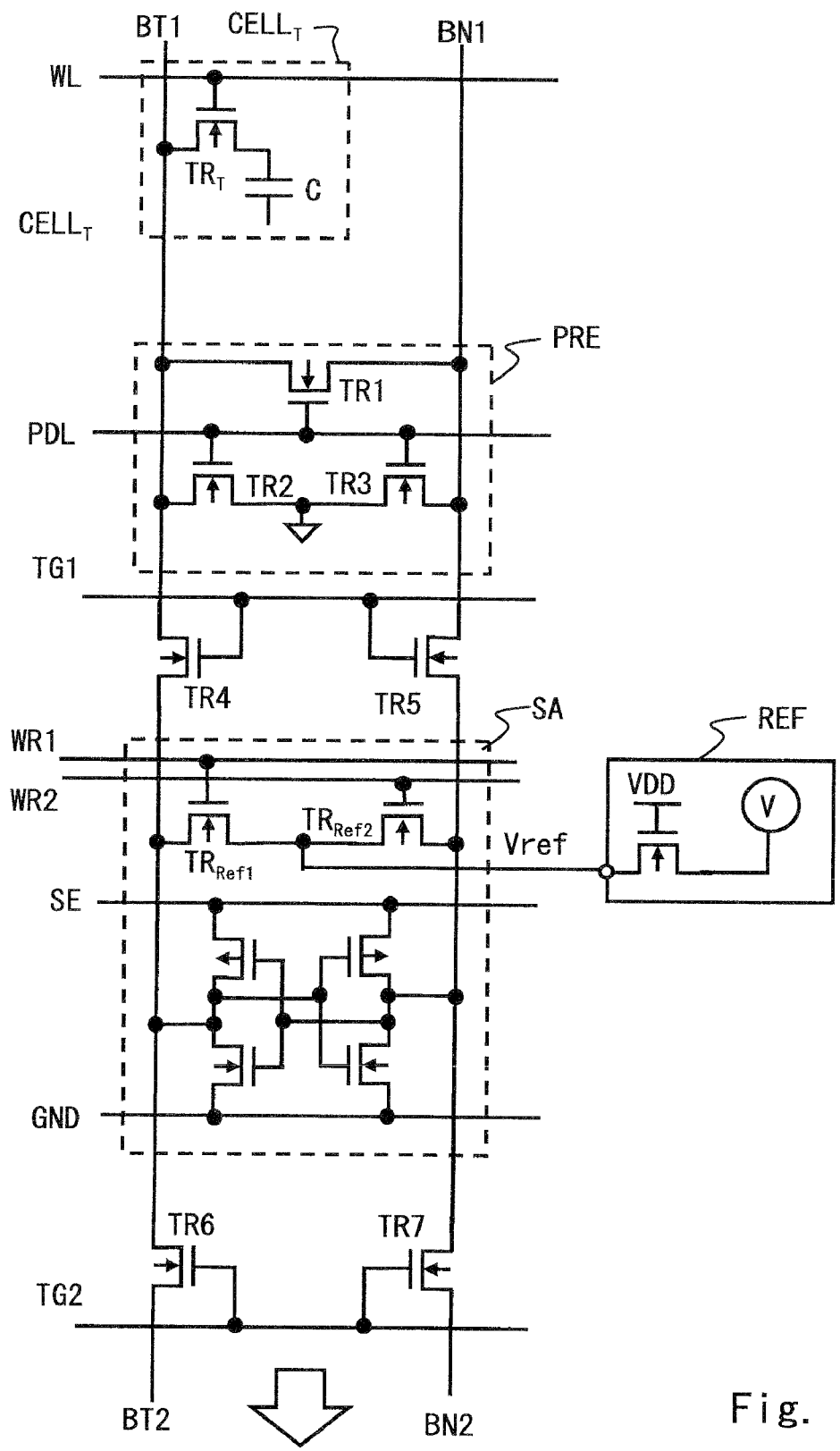
FIG. 5 is a circuit diagram showing a semiconductor memory circuit of a second embodiment.

FIG. 5 shows a portion of the bit line pair of the DRAM of the second embodiment of this invention. The circuit shown in FIG. 5 is a circuit layout of the folded bit arrangement as shown in FIG. 4A. The components same as in FIGS. 1 and 4 are denoted by identical reference numerals and undue explanation is omitted.

The difference between the first embodiment and the second embodiment is that the transistor formed in the sense amplifier unit SA is used as the reference voltage supply transistor so as to apply a reference level to the bit lines BT or BN instead of using the transistor of memory cell unit as the reference voltage supply transistor.

The sense amplifier SA is shared with the bit line pairs at both sides of the sense amplifier SA, because the folded bit arrangement is adopted in this embodiment. Therefore, transistors (bit line pair connection switch) TR4 to TR7 for connecting the both upper and lower side bit line pairs shown in FIG. 5 with the sense amplifier SA are provided. This point is also different from the first embodiment.

As shown in FIG. 5, a transistor $TR_{Ref1}$ is connected between the bit line BT and the reference voltage supply circuit REF. The transistor $TR_{Ref1}$ supplies the reference voltage to the bit line BT. A gate of the transistor $TR_{Ref1}$ is connected to the word line WR1. The transistor $TR_{Ref1}$ supplies the reference voltage Vref to the bit line BT1 while the word line WR1 is set to "H (High)" state.

A transistor $TR_{Ref2}$ is connected between the bit line BN and the reference voltage supply circuit REF. The transistor $TR_{Ref2}$ supplies the reference voltage to the bit line BN. A gate of the transistor $TR_{Ref2}$ is connected to the word line WR2. The transistor $TR_{Ref2}$ supplies the reference voltage Vref to the bit line BN1 while the word line WR2 is set to "H" state.

Each of the transistors TR4 to TR7 is connected between each bit line pairs BT1, BN1 or BT2, BN2 and the sense amplifier SA. The transistors TR4 to TR7 connect the sense amplifier SA with the bit line pair. A signal TG1 for selecting the bit line pair BT1, BN1 is input to the gates of the transistors TR4 and TR5. A signal TG2 for selecting the bit line pair BT2, BN2 is input to the gates of the transistor TR6 and TR7.

An operation of the memory circuit of this embodiment is different from the first embodiment in that one of the bit line pair is connected with the sense amplifier SA in advance based on the bit line pair selection signal TG1 or TG2. That is, the word lines WR1 and WR2 are raised in potential at the same timing with the word line WR as explained in FIG. 2 in the first embodiment. Operational waveforms are same with that of the first embodiment and undue explanation is omitted.

In this embodiment, the transistor for supplying the reference voltage (reference voltage supply transistor) is formed inside the sense amplifier unit SA and the reference voltage is supplied by the transistor formed in a portion of the sense amplifier unit SA. In general, a size of the transistor inside the sense amplifier unit is larger than that inside the cell array unit.

That is, it is realized to supply a more stable reference voltage within a short period of time by supplying the reference voltage using the transistor larger than that formed in the cell array unit. There is no need to provide a transistor for supplying reference voltage for each bit line pair of both sides of the sense amplifier (each upper and lower bit line pairs, each BT1 and BN1, or each BT2 and BN2 as in FIG. 5) in case that the sense amplifier is shared among both of the bit line pairs.

An increase in circuit area is suppressed even if the larger transistor of the sense amplifier unit is used as the reference voltage supply transistor compared with a case where the smaller transistor are provided for each of the upper and lower bit line pairs as the reference voltage supply transistor. That is, it is realized to set the bit lines BT1, BN1, BT2, and BN2 to the reference voltage by just two reference voltage supply transistors of the sense amplifier unit.

Figure 6:
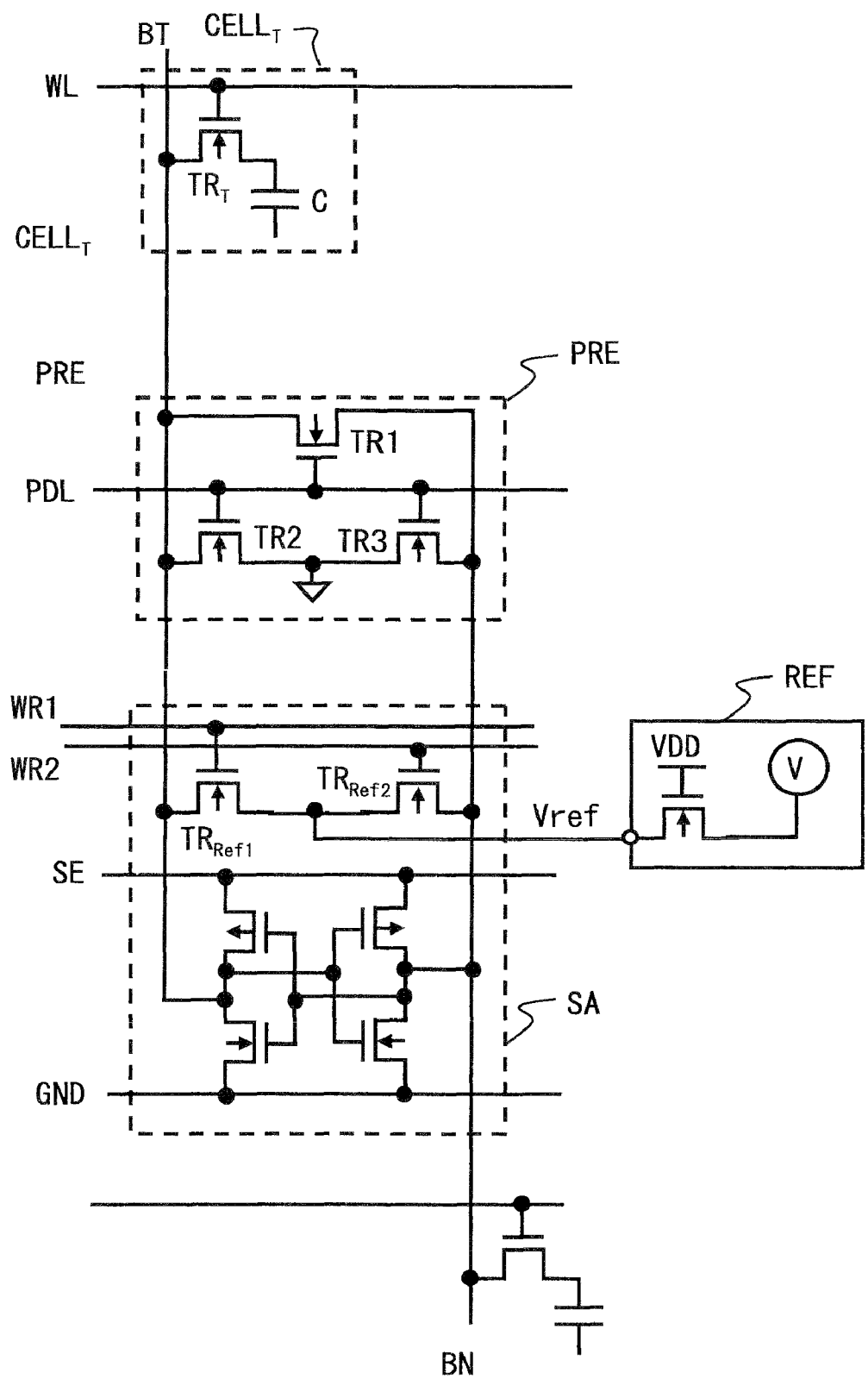
FIG. 6 is a circuit diagram showing a semiconductor memory circuit of the second embodiment.

FIG. 6 is a circuit diagram with adopting the open bit arrangement as shown in FIG. 4B. In the open bit arrangement, left and right bit lines shown in FIG. 4B (upper and lower bit lines in FIG. 6) are used as one bit line pair. Therefore, the transistor $TR_{Ref1}$ for supplying the reference level to the bit line BT is connected between the bit line BT at the upper side of FIG. 6 and the reference voltage. The transistor $TR_{Ref2}$ for supplying the reference voltage to the bit line BN is connected between the bit line BT at the lower side of FIG. 6 and the reference voltage.

In the open bit arrangement, each of the gates of the transistors for supplying the reference voltage is connected to the word line WR1 or WR2. The reference voltage is supplied to the bit line by raising the word line in potential as explained in the folded bit arrangement. A configuration for the bit line selection transistors TR4 to TR7 is omitted here, because one bit line pair is configured with bit lines at upper and lower of the sense amplifier in the open bit arrangement.

Note that, it is possible to connect only the bit line BT with the main cell by providing the reference voltage supply transistor inside the sense amplifier in the open bit arrangement.

When the reference voltage is supplied from the sense amplifier unit, the sense amplifier SA is not required to amplify the level of the bit line BT and the reference voltage supplied by the reference voltage supply transistor to the bit line BN as in the first embodiment or by the dummy cell connected to the bit line BN and forming one of the bit line pair.

This is because the sense amplifier SA only amplifies the potential difference between the voltage supplied from the transistor $TR_{Ref2}$ of the sense amplifier unit and the bit line BT. In this case, it is possible to adopt the open bit arrangement as in FIG. 4C.

Third Embodiment

Figure 7:
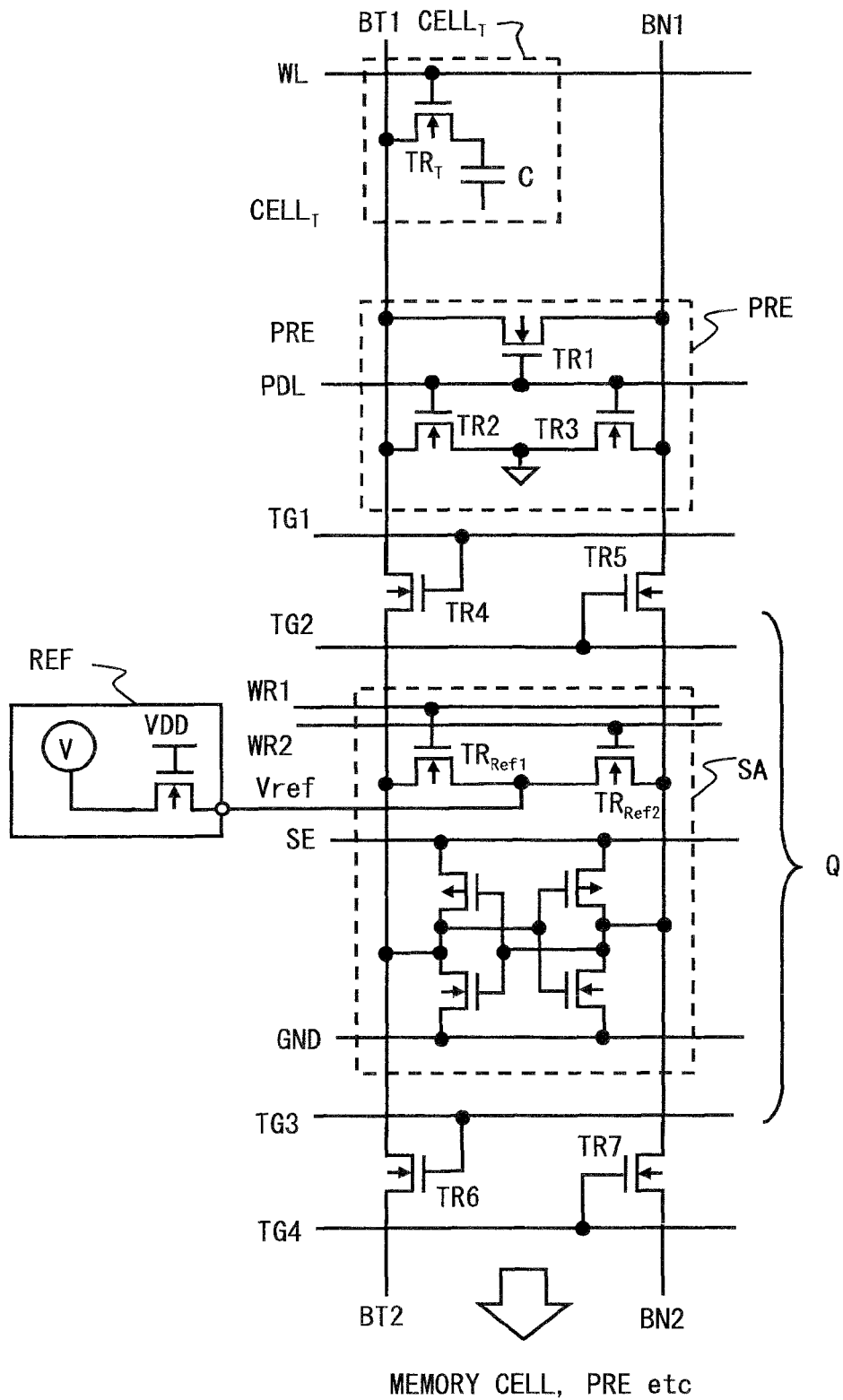
FIG. 7 is a circuit diagram showing a semiconductor memory circuit of the second embodiment.
Figure 8:
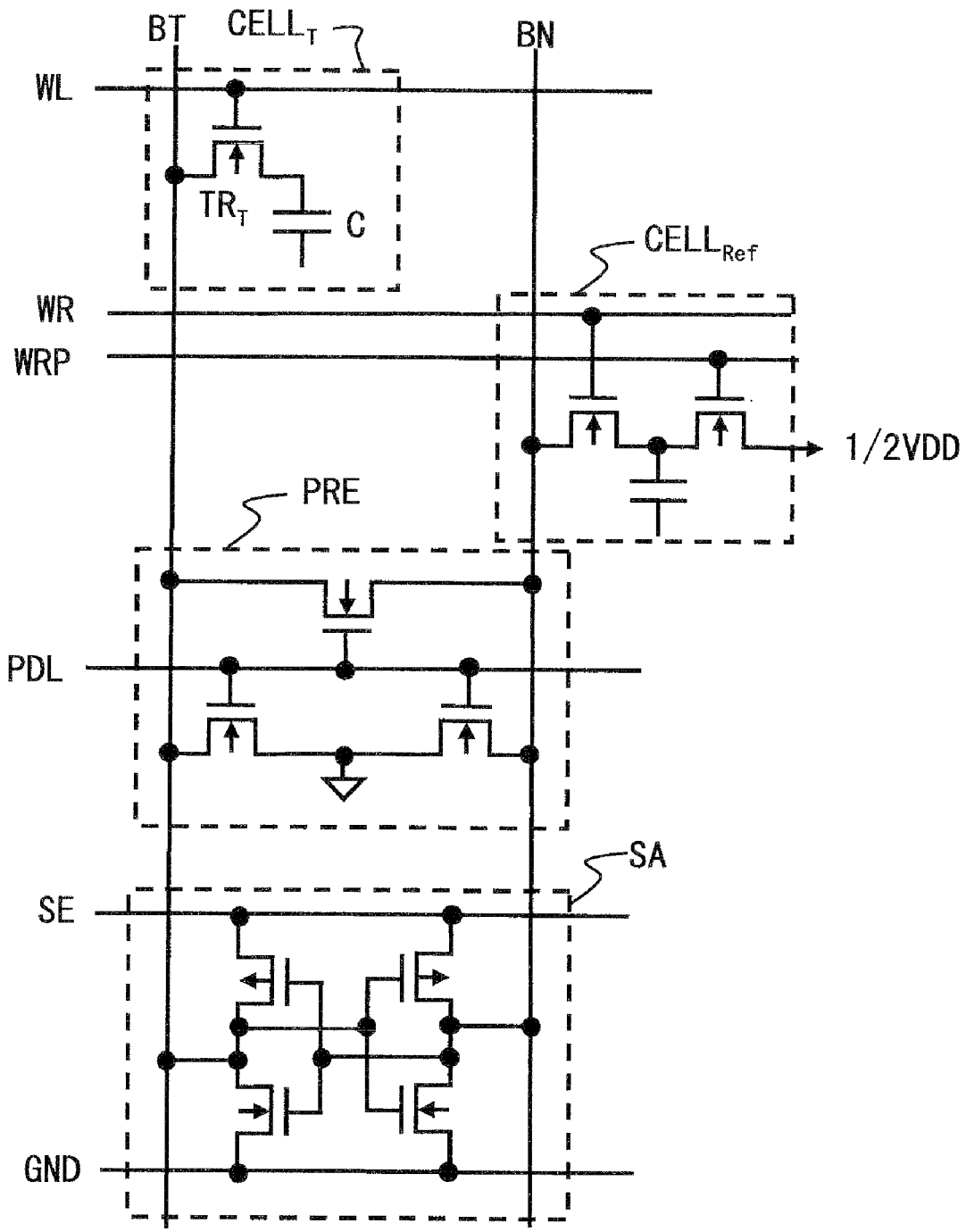
FIG. 8 is a circuit diagram showing a related semiconductor memory circuit.
Figure 9:
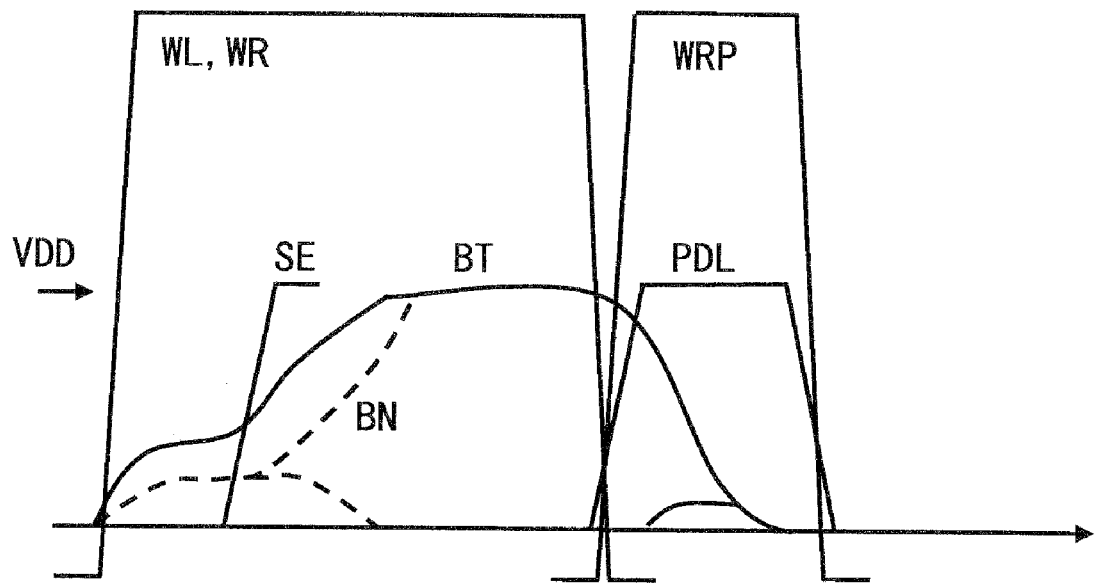
FIG. 9 is a timing chart showing an operation of the related semiconductor memory circuit.

FIG. 7 is a circuit diagram showing a bit line pair of a memory cell of the third embodiment of this invention. The same components as those of FIGS. 1 and 5 are denoted by identical reference numerals and undue explanation is omitted. The memory of this embodiment adopts the folded bit arrangement as shown in FIG. 4A.

The difference between the circuit of FIG. 5 and the circuit of FIG. 7 is that it is possible to input signals to each of the bit line pair selection transistors TR4 to TR7 for independently controlling the conductive states of each transistors TR4 to TR7.

As a result of adopting this configuration, only the TG1 is set to H level and only the transistor TR4 is set to be conductive in accessing the main cell $CELL_T$ that is connected to the bit line BT as shown in FIG. 7 for example. Other control signals TG2 to TG4 are set to L level and non-conductive states are sustained.

In the condition explained above, not all the bit line pairs BN1 are set to the reference voltage Vref when both of the word line WR2 and the sense enable SE are raised in potential as in FIG. 2. That is, the reference voltage level is supplied only to a portion (see a portion Q in FIG. 7) connected to the bit line BN1 inside the sense amplifier SA.

The sense amplifier can operate stably if a stable voltage is applied to one input terminal of the sense amplifier. It is possible to detect the data stored in the main cell after the sense enable is raised in potential.

By adopting these configurations, it is not required to set all of the bit lines to the level of the reference voltage Vref before the sense amplifier starts to operate, thereby making it possible to exclude the effect of the bit line capacitance in case of applying the reference voltage.

It is apparent that the present invention is not limited to the above embodiments, but may be modified and changed without departing from the scope and spirit of the invention.

What is claimed is:

1. A semiconductor memory device comprising:
   a plurality of pairs of bit lines, each of said pairs including;
   a first bit line;
   a second bit line;
   a memory cell coupled to said first bit line, said memory cell being controlled by a first voltage swing;
   a sense amplifier determining the logical value stored in the memory cell according to a potential difference between the first and the second bit line;
   a reference voltage generation circuit having a constant voltage source and an output transistor controlled by an external power source; and
   a reference voltage supply switch connecting the output transistor of the reference voltage generation circuit to the second bit line, said reference voltage supply switch being controlled by a second voltage swing smaller than the first voltage swing.

2. The semiconductor memory device according to claim 1, wherein the reference voltage supply switch is formed by a transistor, and a dummy transistor having substantially a same size with the transistor of the reference voltage supply switch is connected to the first bit line.

3. The semiconductor memory device according to claim 1, further comprising:
   a connection switch connecting the sense amplifier with the first and second bit lines, wherein the reference voltage supply switch comprises:

a first terminal connected to a node between an input of a logic circuit of the sense amplifier and the connection switch; and a second terminal connected to the output transistor of the reference voltage supply circuit.

4. The semiconductor memory device according to claim 3, wherein the connection switch includes:

a first switch connecting the first bit line with the sense amplifier; and a second switch connecting the second bit line with the sense amplifier, wherein each of the conductive state of the first and second switches is controlled based on a different control signal.

5. The semiconductor memory device according to claim 3, wherein the semiconductor memory device is a DRAM with a folded bit arrangement.

6. The semiconductor memory device according to claim 1, wherein said memory cell and said switch are selected by first period and second period shorter than first period, respectively.

7. The semiconductor memory device according to claim 1, wherein each of said first and second bit line is precharged to a ground potential or a power supply potential.

8. The semiconductor memory device according to claim 1, wherein each of said first and second bit line is precharged to a same voltage level before a reading operation.

9. A semiconductor memory device comprising:

a plurality of pairs of bit lines, each of said pairs including;

a first bit line;

a second bit line;

a DRAM cell coupled to said first bit line, said DRAM cell being controlled by a first voltage swing;

a sense amplifier determining the logical value stored in the DRAM cell according to a potential difference between the first and the second bit line;

a reference voltage generation circuit generating a reference voltage; and a reference voltage supply switch coupling an output of the reference voltage generation circuit to the second bit line, said reference voltage supply switch being controlled by a second voltage swing smaller than the first voltage swing, wherein said reference voltage supply switch receives said reference voltage supplied from said reference voltage generation circuit, and said reference voltage supply switch outputs said reference voltage to said second bit line.

* * * * *